(12) United States Patent
Gessert et al.

(10) Patent No.: US 8,747,630 B2
(45) Date of Patent: *Jun. 10, 2014

(54) TRANSPARENT CONDUCTING OXIDES AND PRODUCTION THEREOF

(75) Inventors: Timothy A. Gessert, Conifer, CO (US); Yuki Yoshida, San Jose, CA (US); Timothy J. Coutts, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1698 days.

This patent is subject to a terminal disclaimer.

(21) Appl. No.: 12/130,788

(22) Filed: May 30, 2008

(65) Prior Publication Data
US 2009/0297886 A1   Dec. 3, 2009

Related U.S. Application Data

(63) Continuation-in-part of application No. 11/718,628, filed as application No. PCT/US2007/060553 on Jan. 16, 2007.

(51) Int. Cl.
*C23C 14/00* (2006.01)
*C23C 14/34* (2006.01)

(52) U.S. Cl.
USPC .............. 204/192.29; 204/192.1; 204/192.11; 204/192.15; 252/519.51; 252/518.1

(58) Field of Classification Search
USPC ............. 252/500, 520.1, 520.2, 520.4, 520.5, 252/518.1, 519.51; 204/192.1, 192.11, 204/192.15, 192.29
See application file for complete search history.

(56) References Cited

U.S. PATENT DOCUMENTS

| | | |
|---|---|---|
| 4,395,467 A | 7/1983 | Vossen, Jr. et al. |
| 5,909,623 A | 6/1999 | Saihara |
| 5,922,142 A | 7/1999 | Wu |
| 6,042,752 A | 3/2000 | Mitsui |
| 6,137,048 A | 10/2000 | Wu |
| 6,169,246 B1 | 1/2001 | Wu |
| 6,180,870 B1 | 1/2001 | Sano et al. |
| 6,221,495 B1 | 4/2001 | Wu |
| 6,246,071 B1 | 6/2001 | Qadri et al. |
| 6,281,035 B1 | 8/2001 | Gessert |
| 6,569,548 B2 | 5/2003 | Yamamoto et al. |
| 6,606,333 B2 | 8/2003 | Kadota |
| 6,677,063 B2 | 1/2004 | Finley |
| 6,685,623 B2 | 2/2004 | Presthus et al. |
| 6,733,895 B2 | 5/2004 | Kadota et al. |
| 6,787,253 B2 | 9/2004 | Iwabuchi et al. |
| 6,852,623 B2 | 2/2005 | Park et al. |
| 6,908,782 B2 | 6/2005 | Yan |
| 6,936,761 B2 | 8/2005 | Pichler |
| 7,071,121 B2 | 7/2006 | Punsalan et al. |
| 7,186,465 B2 | 3/2007 | Bright |
| 7,699,965 B2 | 4/2010 | Ikisawa et al. |
| 7,727,910 B2 | 6/2010 | Ahn et al. |
| 2002/0036286 A1 | 3/2002 | Ho et al. |
| 2003/0218153 A1 | 11/2003 | Abe |
| 2005/0062134 A1 | 3/2005 | Ho et al. |
| 2006/0118406 A1 | 6/2006 | Delahoy |
| 2007/0007125 A1 | 1/2007 | Krasnov |
| 2007/0116986 A1 | 5/2007 | Garg et al. |
| 2008/0118777 A1 | 5/2008 | Li et al. |
| 2008/0296569 A1 | 12/2008 | Ho et al. |
| 2009/0197757 A1 | 8/2009 | Fukushima |
| 2009/0297886 A1 | 12/2009 | Gessert et al. |
| 2010/0171082 A1 | 7/2010 | Gessert et al. |
| 2010/0288487 A1 | 11/2010 | Turley et al. |
| 2011/0084239 A1 | 4/2011 | Gessert et al. |
| 2011/0197958 A1 | 8/2011 | Li et al. |
| 2012/0097222 A1 | 4/2012 | Gessert et al. |

FOREIGN PATENT DOCUMENTS

| | | |
|---|---|---|
| CN | 1010377595 | 9/2007 |
| WO | 2009116990 | 9/2009 |

OTHER PUBLICATIONS

PCT/US2007/060553 International Search Report Patent Family Members.
Coutts et al., "Characterization of Transparent Conducting Oxides", MRS Bulletin, 25, pp. 58-65 (Aug. 2000).
Gessert, "Progress and Roadmap Alignment Company or Organization: National Center for Photovitaics [sic.] Funding Opportunity: EE&RE", presented at the Solar Energy Technologies Program (SETP) Annual Program Review Meeting held Aug. 22-24, 2008 in Austin, Texas.
Gessert et al., "High-Transparency Sputtered In2O3 and ITO Films Containing Zirconium", presented at the AVS 54th International Symposium & Exhibition held Oct. 14-17, 2007 in Seattle, Washington.
Burst et al., "RF-Sputtered ITO and ITO:Zr Studied by In Situ Spectroscopic Ellipsometry", Photovoltaic Specialist Conference, 35th IEEE, Jun. 20-25, 2010.
Calnan et al., "High mobility transparent conducting oxides for thin film solar cells", Thin Solid Films, vol. 518, Issue 7, Jan. 31, 2010, pp. 1839-1849.

(Continued)

*Primary Examiner* — Mark Kopec
*Assistant Examiner* — Haidung Nguyen
(74) *Attorney, Agent, or Firm* — John C. Stolpa

(57) ABSTRACT

Transparent conducting oxides and production thereof are disclosed. An exemplary method of producing a transparent conducting oxide (TCO) material may comprise: providing a TCO target doped with either a high-permittivity oxide or a low-permittivity oxide in a process chamber. The method may also comprise depositing a metal oxide on the target in the process chamber to form a thin film having enhanced optical properties without substantially decreasing electrical quality.

30 Claims, 5 Drawing Sheets

(56) References Cited

OTHER PUBLICATIONS

Burst et al., "Recent Developments in Transparent Conducting Oxides for Thin-Film Solar Cells" (Abstract), AVS 57th International Symposium & Exhibition held Oct. 17-22, 2010 in Albuquerque, New Mexico.

Miyata, et al., "New transparent conducting thin films using multicomponent oxides composed of ZnO and V2O5 prepared by magnetron sputtering", Thin Solid Films, vol. 411, Issue 1, May 22, 2002, pp. 76-81.

Tamura et al., "Donor-acceptor pair luminescence in nitrogen-doped ZnO films grown on lattice-matched ScAlMgO4 (0001) substrates", Solid State Communications, vol. 127, Issue 4, Jul. 2003, pp. 265-269.

Kaminska et al., "Properties of p-Type ZnO Grown by Oxidation of Zn-Group-V Compounds", Mater. Res. Soc. Symp. Proc. vol. 957, Fall 206, pp. 121-126.

Wang et al., "Growth of p-type ZnO thin films by (N, Ga) co-doping using DMHy dopant", J. Phys. D: Appl. Phys. vol. 40, No. 15, Aug. 7, 2007, pp. 4682-4685.

Tompa et al., "A comparative study of MOCVD produced Zno films doped with N, As, P and Sb", Mater. Res. Soc. Symp. Proc., vol. 957, Fall 2007, pp. 283-287.

Exharhos et al., "Discovery-based design of transparent conducting oxide films", Thin Solid Films, vol. 515, Issue 18, Jun. 25, 2007, pp. 7025-7052.

U.S. Appl. No. 11/718,628 USPTO Restriction Requirement dated Feb. 25, 2011.

U.S. Appl. No. 11/718,628 USPTO Non-Final Office Action dated Apr. 1, 2011.

U.S. Appl. No. 11/718,628 USPTO Final Rejection dated Sep. 19, 2011.

U.S. Appl. No. 11/718,628 USPTO Non-Final Office Action dated Sep. 11, 2013.

PCT/US07/60553 International Search Report and Written Opinion dated Oct. 10, 2007.

PCT/US07/60553 International Preliminary Report on Patentability dated Jul. 21, 2009.

Haacke, "Transparent Conduction Coatings," Annual Review of Materials Science, vol. 7, Aug. 1997, pp. 73-93.

Chopra et al., "Transparent Conductor—A Status Review," Thin Solid Films, vol. 102, Issue 1, Apr. 1983, pp. 1-46.

Kanai, "Electrical Properties of In2O3 Singe Crystals Doped with Metallic Donor Impurity," Japan Journal of Applied Physics, vol. 23, No. 1, Jan. 1984, p. 127.

Yoshida et al., "Thin-Film Indium Oxide Doped with Refractory Metals," MRS Symp. Proc. vol. 747, pp. V1.4.1-V1.4.6, 2003.

Gessert et al., "Summary Abstract: The dependence of the electrical properties of ion-beam supttered indium tin oxide on its composition and structure," J. Vac. Sci. Technol. A. vol. 5, No. 4, Jul./Aug. 1987.

Kostlin, "Electrical Properites and Defect Model of Tin-Doped Indium Oxide Layers," Applied Physics A, vol. 27, Issue 4, Apr. 1982, pp. 197-206.

Ohta et al., "Highly electrically conductive indium-tin-oxide thin films epitaxially grown on yittria-stabilized zirconia (100) by pulsed-laser deposition," Applied Physics Letters, vol. 76, No. 19, May 8, 2000, pp. 2740-2742.

Ohta et al., "Surface morphology and crystal quality of low resistive indium tin oxide grown on yittria-stabilized zirconia," Journal of Applied Physics, vol. 91, No. 6, Mar. 15, 2002, pp. 3547-3550.

Gessert et al., "Advantages of transparent conducting oxide thin films with controlled pemlitivity for thin film photovoltaic solar cells," Thin Solid Films, vol. 519, Issue 21, Aug. 31, 2011, pp. 7146-7148.

TRANSPARENT CONDUCTING OXIDES AND PRODUCTION THEREOF

This application claims the benefit of U.S. patent application Ser. No. 11/718,628, filed on May 4, 2007 as a continuation-in-part application.

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

TECHNICAL FIELD

The described subject matter relates to transparent conducting oxides and production thereof.

BACKGROUND ART

Transparent conducting oxide (TCO) coatings may be applied to substrates or over-coated on top of other previously deposited layers. Such layers may exhibit high transparency with electrical conductivity ranging from semiconducting to highly conducting. Accordingly, these coatings, or "thin films" as they are often referred to, may be used for a wide range of opto-electronic applications. For example, thin films may be used in the manufacture of electronic devices, such as, liquid crystal displays (LCDs), and touch panel devices (e.g., personal digital assistants (PDAs) and electronic controllers), photovoltaic solar cells and transparent thin film transistors to name only a few examples.

Known deposition techniques may be implemented during the manufacture process to deposit a metal oxide as the thin film on a substrate. Indium Tin Oxide (also commonly referred to as ITO) is often used because it can be deposited at low temperatures, results in smooth films, can be readily etched, and exhibits thermal stability. However, other amorphous or polycrystalline metal oxides may also be used depending on the desired properties of the thin film, cost, operational parameters, and other factors. Furthermore, vacuum deposition using sputtering is a large area process that is widely used in the coating industry.

Achieving the desired opto-electronic properties of the thin film is typically dependent on the amount of oxygen introduced during the deposition process. Unfortunately, controlling the amount of oxygen (or its partial pressure) can be very difficult, especially in large-area production sputtering systems. For example, the amount of oxygen from the target changes with target use. Oxygen from the substrate and internal surfaces of the vacuum chamber is subject to seasonal/daily humidity variations. Maintenance activities also alter outgassing of internal surfaces. In addition, there can also be air leaks in the system. Accordingly, optimizing TCO film properties by controlling the oxygen partial pressure is a delicate process, and ensuring film reproducibility is time consuming and expensive.

The foregoing examples of the related art and limitations related therewith are intended to be illustrative and not exclusive. Other limitations of the related art will become apparent to those of skill in the art upon a reading of the specification and a study of the drawings.

DISCLOSURE OF INVENTION

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

An exemplary method of producing a transparent conducting oxide (TCO) material may comprise: providing a TCO target containing a high-permittivity oxide in a vacuum deposition chamber, and depositing a metal oxide on a substrate from a target in the process chamber to form a thin film having enhanced optical properties without substantially decreasing electrical quality In this example, the thin film has a high infrared transparency.

Another exemplary method of producing a transparent conducting oxide (TCO) material may comprise: providing a TCO target containing a material that yields a lower-permittivity oxide placing the target into a process chamber, and depositing a metal oxide on a substrate from a target in the process chamber to form a thin film having enhanced optical properties without substantially decreasing electrical quality. In this example, the thin film has a lower infrared transparency.

An exemplary method of optimizing electrical and optical properties of a TCO thin film may comprise: providing a TCO target containing a material that widens the range of oxygen partial pressures needed during deposition, and depositing a metal oxide film on a substrate from a target in the process chamber to form the TCO thin film.

Exemplary TCO thin films produced according to the methods described herein may exhibit desirable properties such as high electrical conductivity, high (or low) transparency, and/or other desirable opto-electronic properties.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DESCRIPTION OF THE INVENTION

Briefly, a sputter deposition process to make transparent conducting oxides (TCOs) may be implemented using either a metallic target in an oxygen atmosphere or a ceramic metal oxide target in an atmosphere which may or may not contain oxygen. Electrical and/or optical properties of the transparent conducting oxides may be controlled by varying the ratio of metals and/or the oxygen (e.g., wt %, stoichiometry, partial pressure, etc.) during the sputter deposition process. Accordingly, the transparent conducting oxides produced according to the methods disclosed herein have application in a wide variety of opto-electronic devices. Exemplary transparent conducting oxides and methods of production thereof may be better understood with reference to the Figures and following discussion.

Figure 1:
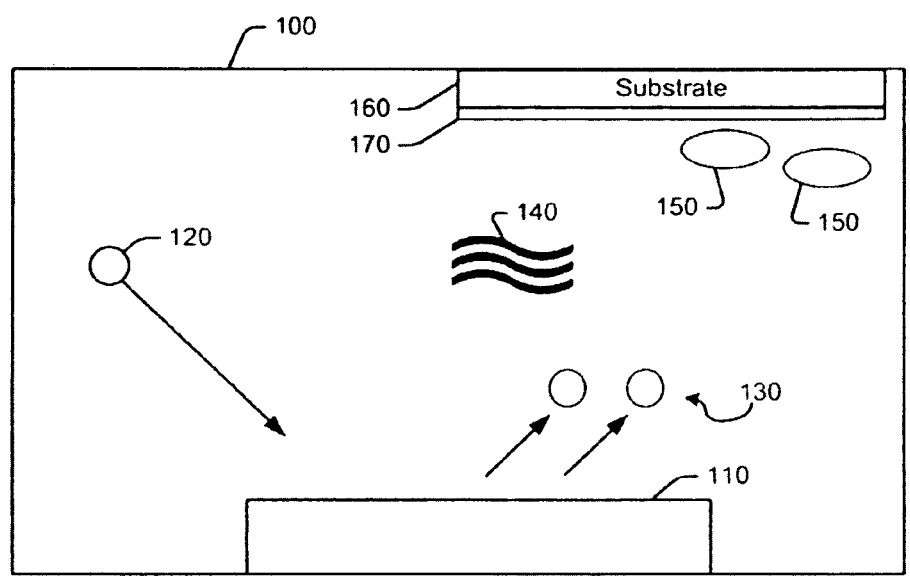
FIG. 1 is a high-level schematic illustration of an exemplary sputtering process for producing transparent conducting oxides.

FIG. 1 is a high-level schematic illustration of an exemplary sputtering process for producing transparent conducting oxides. Sputtering is a physical vapor deposition (PVD) process well known as a means of depositing metal oxide layers (or thin films) on a substrate.

In an exemplary embodiment, the deposition process may be implemented as radio-frequency (RF) magnetron sputtering. A process chamber 100 is provided with a ceramic metal oxide alloy referred to as the target 110. The target 110 may include one or more metal species 112 (e.g., Cu, In, Zn, Ga, Cd, Sn, Al, Ti, and Sb, etc., including others that will be apparent to those skilled in the art). For purposes of illustration, the target 110 in FIG. 1 includes In and Sn. Alternatively, separate targets may be provided for each metal oxide.

It is noted that metal and/or metal alloy targets may be used in place of metal oxide targets. It is also noted that direct current (DC) sputtering or pulsed DC sputtering may also be used instead of RF sputtering. It is also noted that the metal or metal-oxide target may be bombarded by ions from a separate ion source.

During the deposition process, the target 110 may be bombarded by ions 120 (e.g., Argon 40), which causes constituent atoms 130 (e.g., In, Sn, and oxygen ions) to be ejected from the surface of the target 110. These constituent atoms traverse the distance between the target and substrate and recombine to form metal oxide films on the substrate.

In exemplary embodiments, the substrate material 160 may be an electrically conducting and/or transparent material, e.g., glass, tin oxide-coated glass, copper, aluminum or other material. However, the substrate material 160 is not limited to any particular type of material. The substrate material 160 will depend at least to some extent on the application, as will be understood by those having ordinary skill in the art after becoming familiar with the teachings herein. The metal oxide coating may also be over-coated on previously deposited and processed layers on the substrate, such as, e.g., when making a top contact to a opto-electronic device with a layered structure.

It is noted that the deposition process may also include additional operations. In an exemplary embodiment, the substrate material 160 having the deposited metal oxide thin film 170 may be thermally annealed. Other operations may also include varying operating parameters, e.g., temperature, relative concentrations of the metal ions, etc. Still other operations may also be implemented, as may be required to produce composite materials with the desired physical and electronic properties.

Before continuing, it is also noted that the deposition process described above with reference to FIG. 1 is provided for purposes of illustration and is not intended to be limiting. Other types of deposition processes, e.g., chemical vapor deposition, physical vapor deposition or others, now known or later developed, are also contemplated as being suitable for the described purposes.

Optimization of the properties of transparent conducting oxides involves maximizing their optical transmittance and electrical conductivity. Generally, these two characteristics are conflicting. That is, increasing either one usually means decreasing the other. Various figures-of-merit describing the performance of transparent conducting oxides have been used but a useful definition is given by equation (1), where A is the optical absorbance and $R_w$ is the sheet resistance (Ω per square).

$$\phi = \log A/R_w, \qquad \text{Equation (1)}$$

The optical absorbance is generally expressed by Beer's law, in which α is the optical absorption coefficient (cm$^{-1}$) and t is the thickness (cm).

$$A = \exp(-\alpha t), \qquad \text{Equation (2)}$$

Substitution of equation (2) in equation (1), and knowing that $R_0 = \rho/t$, gives equation (3), where σ is the conductivity (i.e., the reciprocal of the resistivity, ρ), and the dimensions of φ are ohms$^{-1}$.

$$\phi = \sigma/\alpha. \qquad \text{Equation (3)}$$

Unlike other figures-of-merit, this quantity is independent of film thickness and depends only on fundamental properties of the material. Increasing the figure-of-merit may be achieved by an increase in conductivity, without an equal increase in optical absorption, or by a decrease in optical absorption, without an equivalent decrease in conductivity.

The absorption coefficient may be expressed in terms of the extinction coefficient, k, with λ being the wavelength.

$$\alpha = \frac{4\pi k}{\lambda}, \qquad \text{Equation (4)}$$

Now from Maxwell's theory of electromagnetic radiation, the imaginary part of the dielectric permittivity is given by equation 5, where N is the refractive index.

$$\epsilon_2 = 2Nk, \qquad \text{Equation (5)}$$

In addition, Drude's theory of free electrons gives equation 6, where n is the free-carrier concentration (m$^{-3}$), e is the electronic charge (coulombs), $\epsilon_0$ is the permittivity of free space (farads m$^{-1}$), ω is the angular frequency of the radiation (s$^{-1}$) and τ is the relaxation time (s).

$$\varepsilon_2 = \left(\frac{ne^2}{\varepsilon_0 m^*}\right)\frac{1}{\omega^3 \tau}. \qquad \text{Equation (6)}$$

Hence, an alternative expression for the extinction coefficient is derived in equation (7).

$$k = \frac{1}{2N}\left(\frac{ne^2}{\varepsilon_0 m^*}\right)\frac{1}{\omega^3 \tau} \qquad \text{Equation (7)}$$

Substituting equation (7) into equation (3) results in equation 8.

$$\alpha = \frac{4\pi}{\lambda}\left(\frac{ne^2}{\varepsilon_0 m^*}\right)\frac{1}{2N\omega^3 \tau}. \qquad \text{Equation (8)}$$

In addition, equation (9) can be substituted into equation (8) to give equation 10.

$$\lambda = \frac{2\pi c}{\omega} \qquad \text{Equation (9)}$$

$$\alpha = \frac{1}{Nc}\left(\frac{ne^2}{\varepsilon_0 m^*}\right)\frac{1}{\omega^2 \tau}. \qquad \text{Equation (10)}$$

This expression may now be substituted into equation (2) and, knowing that $\sigma = ne\mu$, equation (11) may be derived, which reveals the significance of the relaxation time, $\tau$.

$$\phi = Nc\varepsilon_0 \tau^2 \omega^2, \qquad \text{Equation (11)}$$

Equation 12 is from Maxwell's theory, where $\in_1$ is the real part of the dielectric permittivity, which is dimensionless.

$$\in_1 = N^2 - k^2. \qquad \text{Equation (12)}$$

For most of the visible spectrum, $k \sim 0$ so $N = \sqrt{\in_1}$. Therefore, substituting the latter expression into equation (11) results in equation (13).

$$\phi = \sqrt{\in_1} c \varepsilon_0 \tau^2 \omega^2. \qquad \text{Equation (13)}$$

This shows that the figure-of-merit increases with the square root of the real part of the dielectric permittivity. This is true irrespective of the magnitudes of N and k. Hence, an increase in the permittivity of a TCO leads to an increase in its figure-of-merit for a given relaxation time. Although $\tau$ is a more sensitive factor (i.e., the figure-of-merit increases as its square), the influence of the permittivity has not generally been appreciated. However, this dependence helps to explain the results obtained with $ZrO_2$ added to indium oxide. That is, the zirconia has a very large permittivity and, even in relatively small concentrations, may make a significant difference to the optical properties.

A method for producing TCO films may comprise: adding small amounts of oxides that have large values of high-frequency dielectric permittivity, $\in_\infty$ ($TiO_2$, $ZrO_2$, $HfO_2$, $V_2O_5$ etc.) to traditional TCO materials (e.g., $In_2O_3$:Sn, $SnO_2$:F, ZnO:Al, etc). Such an embodiment improves the optical transmission of the resulting TCO film without reducing the electrical quality of the film.

In this method, the optical absorption of a TCO film is not only a function of its oxygen content (as discussed above) but also of its high-frequency dielectric permittivity (e). Using these formalisms, the effect can be mathematically modeled by systematically varying $\in_\infty$ from a value of 4 to a value of 7 and observing the effect this has on the optical performance of a typical TCO. This range of $\in_\infty$ is consistent with expected variations in the TCO films.

Figure 2:
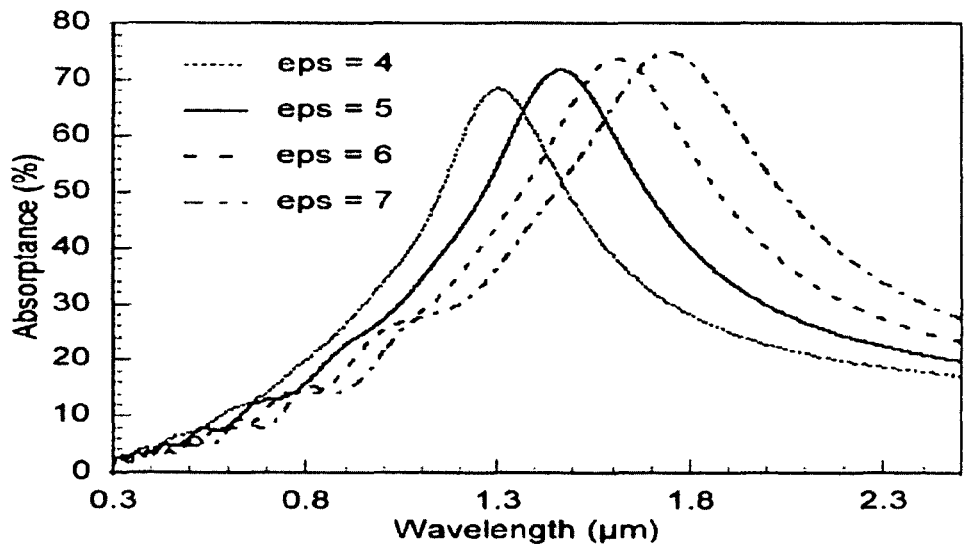
FIG. 2 is a plot showing modeled absorption, as a function of wavelength, for four exemplary TCO films.
Figure 3:
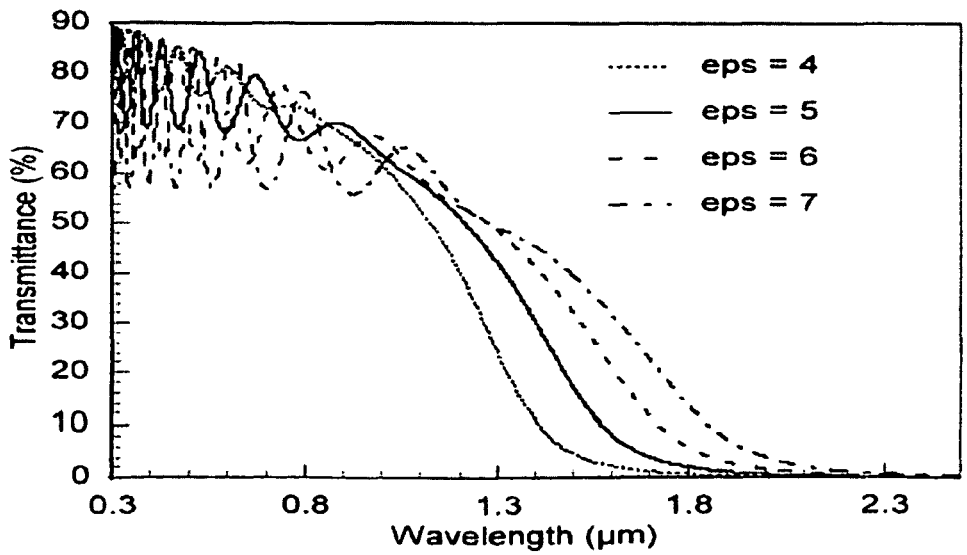
FIG. 3 is a plot showing modeled transmittance as a function of wavelength for the same set of exemplary films shown in FIG. 2.
Figure 4:
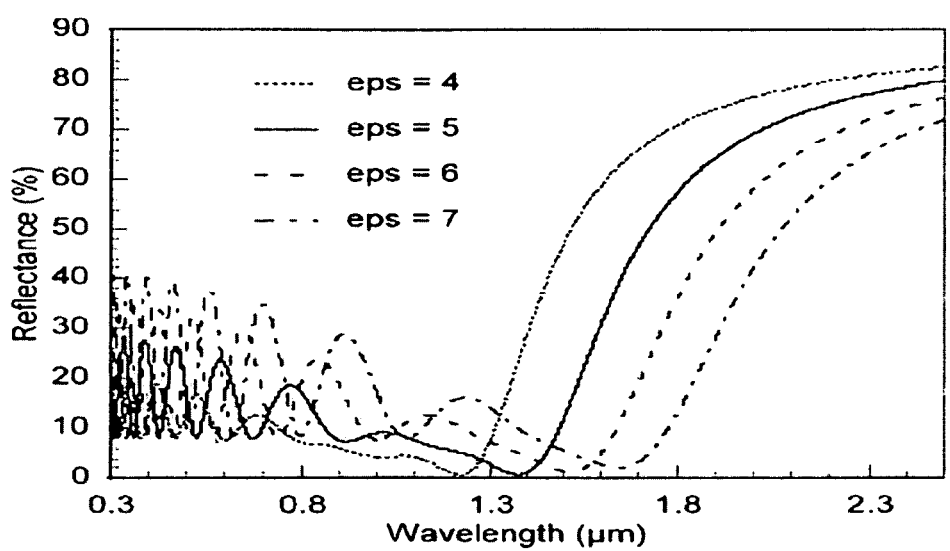
FIG. 4 is a plot showing modeled reflectance as a function of wavelength for the same set of exemplary films shown in FIGS. 2 and 3.

The following modeling shows the variation of the optical properties of films with typical carrier concentration, mobility and film thickness for TCOs. FIGS. 2-4 show the absorption as a function of wavelength for four values of permittivity (4, 5, 6, 7). In each of these, carrier concentration and mobility were taken as $7 \times 10^{20}$ cm$^{-3}$ and 35 cm$^2$ V$^{-1}$ s$^{-1}$, respectively. The effective mass and film thickness were taken as 0.35 m$_e$ (m$_e$=mass of the electron) and 500 nm, respectively.

FIG. 2 is a plot showing modeled absorption, as a function of wavelength, for four exemplary TCO films. FIG. 3 is a plot showing modeled transmittance as a function of wavelength for the same set of exemplary films shown in FIG. 2. FIG. 4 is a plot showing modeled reflectance as a function of wavelength for the same set of exemplary films shown in FIGS. 2 and 3.

The peak of the absorption vs. wavelength curves occurs close to the plasma wavelength. As the real part of the permittivity is increased, it may be seen that the peak of the absorption moves to a longer wavelength. Consequently, the optical absorption is reduced on the short-wavelength side of the plasma wavelength, which is desired for applications in the visible spectrum.

Accordingly, the method described above may be implemented to produce high quality sputtered $In_2O_3$:Zr films in pure Ar. Adding $ZrO_2$ to the target of traditional TCOs improves film transparency in the visible range of wavelengths. Adding $ZrO_2$ to the target of traditional TCOs also maintains high carrier concentration at higher oxygen partial pressures. The method may also be used to widen the process window during TCO production. It is noted that other refractory metals or metal oxides (e.g., $In_2O_3$:Hf) and/or other TCO host materials may also be used.

It is readily appreciated that applications of this technology may include, but are not limited to, liquid crystal displays (LCDs), touch panel devices (e.g., personal digital assistants or PDAs), photovoltaic solar cells, transparent thin film transistors, low-emissivity window glass, and other opto-electronic applications.

By way of example, the development of multi-junction thin-film photovoltaic solar cell devices with 25% conversion efficiency may be accomplished by incorporating the TCO materials produced according to the methods described herein into photovoltaic devices that have much higher NIR transmission than found in traditional TCOs. Specifically, TCOs may be used having both a low sheet resistance and a high transmission between about 800 and 1300 nm.

The increased transmittance of the TCO materials produced according to the methods described herein may also enable lower power consumption in flat panel displays (and hence a longer battery lifetime). The TCOs may also exhibit enhanced wear-resistance, mechanical durability, and/or chemical resistance.

EXAMPLE

In this example, thin films were fabricated of a traditional TCO material containing a small amount of a high-permittivity oxide. The goal was to gain an advantage in the optical properties from the high-$\in$ material without suffering loss of electrical quality. Films were produced by radio-frequency (RF) magnetron sputtering. Film composition was fixed by using sputtering targets that were custom fabricated using a small amount of $ZrO_2$ for the high-$\in$ component, and $In_2O_3$ combined with $SnO_2$ (ITO) for the traditional (host) TCO component.

A 2-inch diameter sputtering target was produced by a commercial manufacturer using 1 weight percent (wt %) of fully oxidized zirconium oxide ($ZrO_2$) powder, 9 wt % of fully oxidized $SnO_2$ powder, and 90 wt % fully oxidized $In_2O_3$ powder. The mixture was hot pressed to the approximate target dimensions required, followed by mechanically sizing to more-accurate dimensions. The target was then fully re-oxidized using a high-temperature anneal in ambient oxygen.

Film deposition was conducted in a high-vacuum sputtering system that allows for control of an ambient environment containing both Ar and oxygen. Films were deposited onto Corning 1737 glass substrates at temperatures of 350° C. The RF sputtered films produced using the ITO/$ZrO_2$ target are referred to as "ITZO" films.

The example also included fabrication of RF sputter deposited ITO films. The ITO sputtering target was produced as described above, except that it did not contain $ZrO_2$ (i.e., the mixture was 9 weight percent $SnO_2$ and 91 wt % $In_2O_3$). The ITO films were produced during the same time period so that the films could be used as "control samples" to isolate effects due to the high-∈ component, ($ZrO_2$), ITO. It should also be noted that the ITO films produced for this comparison are among the highest quality ITO films produced, and so a favorable comparison with these particular ITO films represents a very high standard.

Figure 5:
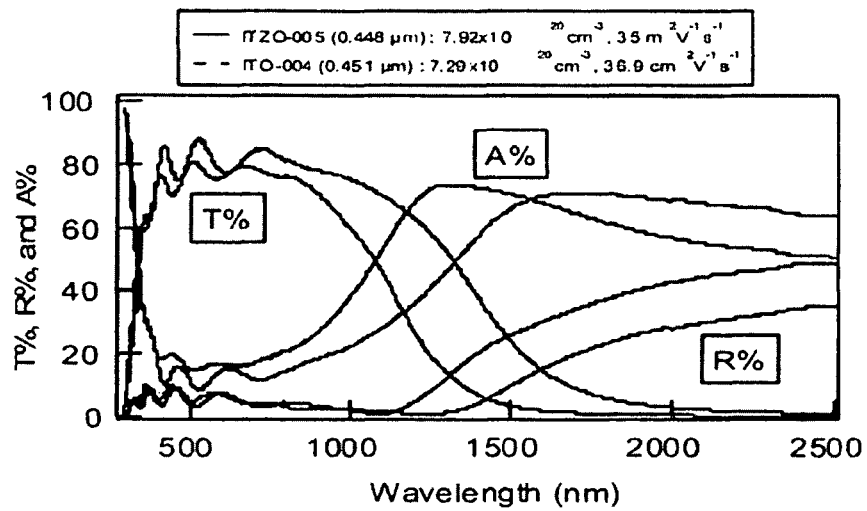
FIG. 5 is a plot comparing optical properties of exemplary ITZO and ITO films.
Figure 6:
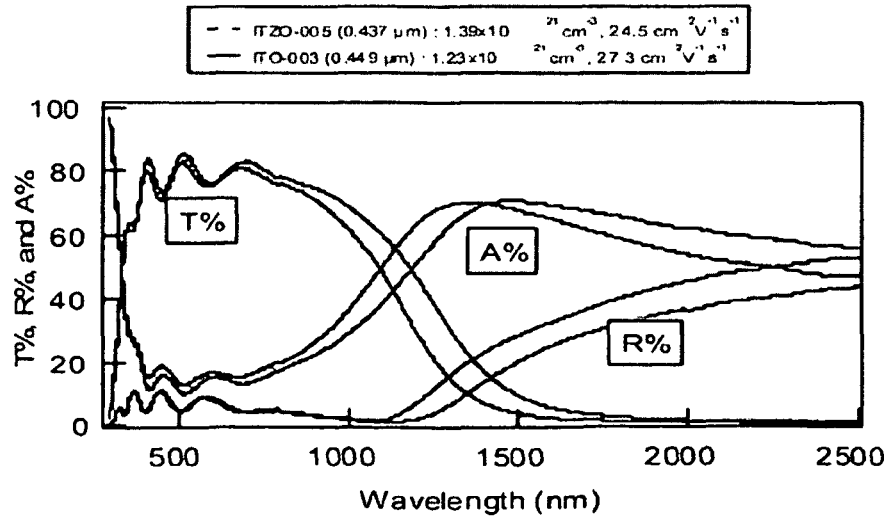
FIG. 6 is another plot comparing optical properties of exemplary ITZO and ITO films.

In FIGS. 5 and 6, we compare the ITO and ITZO films that we have produced. In each figure, we have been careful to choose films that demonstrate similar thickness and electrical properties (carrier concentrations and mobility, measured using room-temperature Hall measurements). This degree of film similarity minimizes effects due to free-carrier absorption.

FIG. 5 is a plot comparing optical properties of ITZO and ITO films. In this example, the ITZO and ITO films have similar thickness of about 450 nm, n of about $7 \times 10^{20}$ $cm^{-3}$, and μ of about 35 $cm^2 V^{-1} s^{-1}$. FIG. 6 is another plot comparing optical properties of exemplary ITZO and ITO films. In this example, the ITZO and ITO films have similar thickness of about 440 nm, n of about $1.3 \times 10^{21}$ $cm^{-3}$, and μ of about 26 $cm^2 V^{-1} s^{-1}$.

It is readily observed in FIGS. 5 and 6 that the ITZO films demonstrate significantly higher NIR transmission. The IZTO films also have good electrical quality (i.e., films were deposited with nearly identical n and μ at nearly identical thicknesses). It can also be seen that the behavior of the ITZO film is similar to that described. Hence, the addition of the $ZrO_2$, which has increased permittivity, leads to the behavior observed in FIGS. 5 and 6.

It is noted that, although $ZrO_2$ and ITO were used in this example, similar high-∈ oxides (e.g., $TiO_2$, $HfO_2$, etc.) and/or other traditional host TCO materials ($SnO_2$:F, ZnO:Al, etc.) may also be used to produce similar results. It is also noted that the optical properties may be tuned to longer or to shorter wavelengths using the permittivity as a control parameter. In addition, the work function of the host TCO may be changed by the addition of high-∈ oxides, because these also tend to have a large work function.

Figure 7:
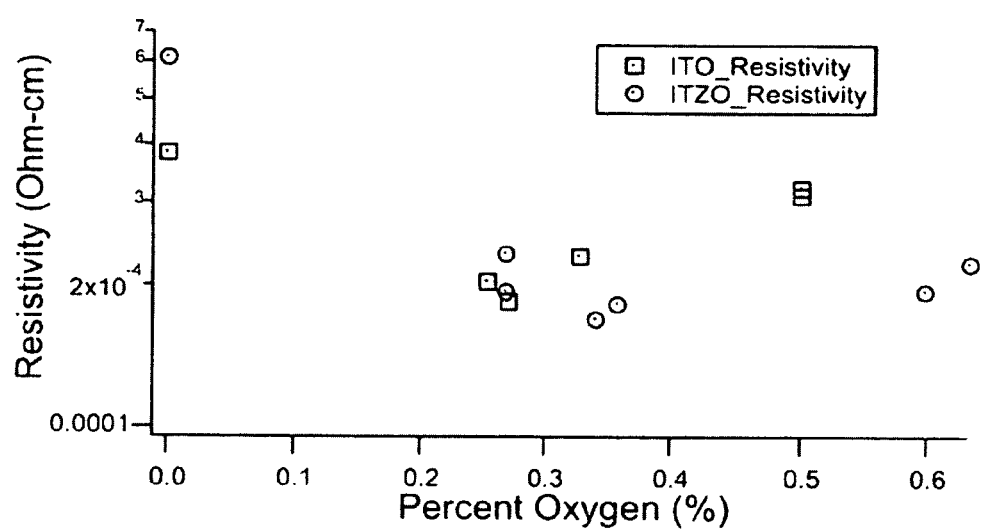
FIG. 7 is a plot showing optimizing the combination of electrical and optical properties of ITZO.

FIG. 7 is a plot comparing showing optimizing the combination of electrical and optical process window ranges of ITO and properties of ITZO. It is observed that the combination of electrical and optical properties of ITZO (Window 1) can be optimized over a much wider range of oxygen partial pressure than typical ITO (Window 2) for a given resistivity (process windows about $3 \times 10^{-4}$ Ohm-cm is shown for resistivity ≤$3 \times 10^{-4}$ Ohm-cm).

At low levels of ambient oxygen, addition of Zr (or similar materials) to the $In_2O_3$ matrix (or similar TCOs) may limit the formation of low-transparency phases when the sputtering ambient environment cannot supply sufficient oxygen. But because Zr is also an effective donor in $In_2O_3$, both electrical and optical quality are maintained at low oxygen partial pressure.

At high levels of ambient oxygen, addition of Zr (or similar materials) to the $In_2O_3$ matrix may getter excess oxygen into strong $ZrO_2$ bonding, allowing oxygen vacancies to be retained as donors and/or limiting detrimental effects of interstitial oxygen in the $In_2O_3$ lattice to be retained as donors. This may be similar to the gettering process in non-evaporative getter (NEG) materials where Zr is also used because of its high reactivity.

Both of these results can provide advantages in a TCO production environment because the range of oxygen partial pressure where optimum films are produced is extended, and because optimization is enabled by the target composition rather than the (less predictable) oxygen partial pressure in the sputtering ambient.

The Example discussed above is provided for purposes of illustration and is not intended to be limiting. Still other embodiments and modifications are also contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as arc within their true spirit and scope.

We claim:

1. A method of producing a transparent conducting oxide (TCO) material, comprising:
    positioning a substrate within a process chamber;
    providing a TCO target in the process chamber, wherein the TCO target comprises a host oxide and an amount of an added oxide; and
    from the target, depositing a TCO metal oxide formed from the host and added oxides to form a thin film on the substrate,
    wherein optical transmission of the thin film formed with the TCO metal oxide is greater than optical transmission of a second thin film formed from a target comprising the host oxide and free of the amount of the added oxide,
    wherein the thin film formed with the TCO metal oxide has an electrical quality at least as great as the electrical quality of the second thin film, and
    wherein the depositing comprises sputter depositing the TCO metal oxide in a mixture of less than about 0.8 percent oxygen and argon.

2. The method of claim 1, wherein the added oxide is a high-permittivity oxide, whereby the thin film formed from the TCO metal oxide has a permittivity greater than the second thin film.

3. The method of claim 2, wherein, when the depositing is done at a first oxygen partial pressure, the thin film formed with the TCO metal oxide has a first carrier concentration and, when the depositing is performed at a second oxygen partial pressure greater than the first oxygen partial pressure, the thin film formed with the TCO metal oxide has a second carrier concentration at least as great as the first carrier concentration.

4. A method of producing a transparent conducting oxide (TCO) material, comprising:
    positioning a substrate within a process chamber;
    providing a TCO target in the process chamber, wherein the TCO target comprises a host oxide and an amount of an added oxide; and
    from the target, depositing a TCO metal oxide formed from the host and added oxides to form a thin film on the substrate,
    wherein optical transmission of the thin film formed with the TCO metal oxide is greater than optical transmission of a second thin film formed from a target comprising the host oxide and free of the amount of the added oxide,
    wherein the thin film formed with the TCO metal oxide has an electrical quality at least as great as the electrical quality of the second thin film, and
    wherein the depositing comprises chemical vapor deposition (CVD) or spray deposition of the TCO metal oxide in a mixture of oxygen and argon containing less than about 0.6 percent of oxygen, and wherein the added oxide contains a high-permittivity addition.

5. The method of claim 1, wherein the depositing comprises depositing the TCO metal oxide from the TCO target, which comprises a metal target, in the mixture of oxygen and argon containing less than about 0.6 percent of oxygen.

6. The method of claim 1, wherein the mixture further comprises hydrogen, the mixture containing less than about 0.6 percent of oxygen.

7. The method of claim 1, wherein the depositing is performed at about 350° C. to 500° C.

8. The method of claim 2, wherein the added oxide is selected from the group of high-permittivity oxides consisting of: $Nb_2O_5$, $V_2O_5$, $TiO_2$, $ZrO_2$, and $HfO_2$.

9. The method of claim 2, wherein the amount of the added oxide is about 1 weight percent.

10. A method of producing a transparent conducting oxide (TCO) material, comprising:
   positioning a substrate within a process chamber;
   providing a TCO target in the process chamber, wherein the TCO target comprises a host oxide and an amount of an added oxide; and
   from the target, depositing a TCO metal oxide formed from the host and added oxides to form a thin film on the substrate,
   wherein optical transmission of the thin film formed with the TCO metal oxide is greater than optical transmission of a second thin film formed from a target comprising the host oxide and free of the amount of the added oxide,
   wherein the thin film formed with the TCO metal oxide has an electrical quality at least as great as the electrical quality of the second thin film, and
   wherein, during the depositing step, an ambient environment of argon and less than about 0.8 percent oxygen is provided in the process chamber.

11. The method of claim 10, wherein the ambient environment comprises less than about 0.6 percent oxygen.

12. A method of forming a transparent conducting oxide (TCO) thin film, comprising:
   positioning a substrate within a deposition chamber;
   positioning a target in the deposition chamber, wherein the target comprises a host oxide and an added amount of an oxide having a permittivity greater than or equal to a permittivity of $ZrO_2$; and
   using the target, depositing a thin film of material on the substrate, wherein the depositing includes providing an ambient environment comprising a mixture of argon and oxygen in the deposition chamber and wherein a process window defined by a range of differing percentage values of the oxygen in the mixture during the depositing is at least about 0.1 percent to obtain a predefined electrical quality in the thin film,
   wherein the range of the differing percentage values of the oxygen is at least about 0.3 percent, and
   wherein the oxygen in the mixture is controlled to be in the range of 0.25 percent to 0.625, whereby the range of the process window is 0.375 percent.

13. The method of claim 12, wherein the added oxide is selected from the group consisting of: $Nb_2O_5$, $V_2O_5$, $TiO_2$, $ZrO_2$, and $HfO_2$ and the mixture includes less than about 0.625 percent oxygen.

14. The method of claim 13, wherein the host oxide comprises $In_2O_3$:Sn, $SnO_2$:F, or ZnO:Al.

15. The method of claim 13, wherein the amount of the added oxide in the target in an amount of about 1 weight percent.

16. The method of claim 12, wherein the predefined electrical quality is resistivity of the thin film, whereby the resistivity has a value within a preset acceptable range when the mixture is controlled during the depositing to contain a percentage of the oxygen falling within the range of the process window.

17. The method of claim 12, wherein the thin film has an optical quality that has a value that is greater than a value of the optical quality for a thin film formed from a target including the host oxide without the amount of the added oxide.

18. The method of claim 17, wherein the optical quality is NIR transmission.

19. A method of forming a transparent conducting oxide (TCO) thin film, comprising:
   positioning a substrate within a process chamber;
   positioning a TCO target in the process chamber, wherein the target comprises a host oxide and an added amount of an oxide selected from the group consisting of $Nb_2O_5$, $V_2O_5$, $TiO_2$, $ZrO_2$, and $HfO_2$; and
   performing sputtering with the target to deposit a thin film on the substrate,
   wherein the depositing includes providing an ambient environment comprising a mixture of argon and oxygen in the process chamber,
   wherein the thin film has NIR transmission greater than NIR transmission for a second thin film formed by performing the sputtering using a target including the host oxide without the amount of the added oxide,
   wherein the oxygen in the mixture is controlled to be in a range of 0.25 percent to 0.625, and
   wherein the thin film and the second thin film have substantially equivalent values of resistivity when formed with the mixture controlled to a value across the range of the oxygen.

20. The method of claim 19, wherein the host oxide comprises $In_2O_3$:Sn, $SnO_2$:F, or ZnO:Al.

21. The method of claim 19, wherein the amount of the added oxide in the target is at least about 1 weight percent.

22. The method of claim 10, wherein, when the depositing is done at a first oxygen partial pressure, the thin film formed with the TCO metal oxide has a first carrier concentration and, when the depositing is performed at a second oxygen partial pressure greater than the first oxygen partial pressure, the thin film formed with the TCO metal oxide has a second carrier concentration at least as great as the first carrier concentration.

23. The method of claim 10, wherein the depositing is performed at about 350° C. to 500° C.

24. The method of claim 10, wherein the added oxide is selected from the group of high-permittivity oxides consisting of: $Nb_2O_5$, $V_2O_5$, $TiO_2$, $ZrO_2$, and $HfO_2$.

25. The method of claim 10, wherein the amount of the added oxide is about 1 weight percent.

26. A method of forming a transparent conducting oxide (TCO) thin film, comprising:
   positioning a substrate within a deposition chamber;
   positioning a target in the deposition chamber, wherein the target comprises a host oxide and an added amount of an oxide having a permittivity greater than or equal to a permittivity of $ZrO_2$; and
   using the target, depositing a thin film of material on the substrate,
   wherein the depositing includes providing an ambient environment comprising a mixture of argon and oxygen in the deposition chamber,
   wherein a process window defined by a range of differing percentage values of the oxygen in the mixture during the depositing is at least about 0.1 percent to obtain a predefined electrical quality in the thin film, and wherein the added oxide is selected from the group consisting of: $Nb_2O_5$, $V_2O_5$, $TiO_2$, $ZrO_2$, and $HfO_2$ and the mixture includes less than about 0.625 percent oxygen.

27. The method of claim 26, wherein the host oxide comprises $In_2O_3$:Sn, $SnO_2$:F, or ZnO:Al.

28. The method of claim 26, wherein the amount of the added oxide in the target is an amount of about 1 weight percent.

29. The method of claim 26, wherein the predefined electrical quality is resistivity of the thin film, whereby the resistivity has a value within a preset acceptable range when the mixture is controlled during the depositing to contain a percentage of the oxygen falling within the range of the process window.

30. The method of claim 26, wherein the thin film has an optical quality that has a value that is greater than a value of the optical quality for a thin film formed from a target including the host oxide without the amount of the added oxide.

* * * * *